US009207733B2

(12) United States Patent
Kim

(10) Patent No.: US 9,207,733 B2
(45) Date of Patent: Dec. 8, 2015

(54) DATA BUFFER SYSTEM AND POWER CONTROL METHOD

(71) Applicant: NANYA TECHNOLOGY CORPORATION, Tao-Yuan Hsien (TW)

(72) Inventor: Gi-Hong Kim, Boise, ID (US)

(73) Assignee: NANYA TECHNOLOGY CORPORATION, Taoyuan (TW)

( * ) Notice: Subject to any disclaimer, the term of this patent is extended or adjusted under 35 U.S.C. 154(b) by 129 days.

(21) Appl. No.: 13/960,815

(22) Filed: Aug. 7, 2013

(65) Prior Publication Data

US 2015/0046738 A1    Feb. 12, 2015

(51) Int. Cl.
*G06F 1/26* (2006.01)

(52) U.S. Cl.
CPC ............ *G06F 1/26* (2013.01); *G09G 2310/027* (2013.01); *G09G 2310/0291* (2013.01)

(58) Field of Classification Search
CPC ................. G09G 2310/0291; G09G 2310/027
See application file for complete search history.

(56) References Cited

U.S. PATENT DOCUMENTS

2009/0295467 A1* 12/2009 Berzins et al. ................ 327/544

* cited by examiner

*Primary Examiner* — Zachary K Huson
(74) *Attorney, Agent, or Firm* — CKC & Partners Co., Ltd.

(57) ABSTRACT

A data buffer system includes a plurality of data buffer modules and a plurality of switching units. The data buffer module is configured for buffering a corresponding data signal. The data buffer module includes a plurality of buffers. The buffers are electrically coupled in series. The switching unit is configured for supplying power to the corresponding buffer in accordance with a regulated voltage. Each of the switching units is electrically coupled between the corresponding one of the buffers and the supply voltage. A power control method for a data buffer system is also provided.

13 Claims, 8 Drawing Sheets

DATA BUFFER SYSTEM AND POWER CONTROL METHOD

BACKGROUND

1. Field of Invention

The present invention relates an integrated circuit. More particularly, the present invention relates to a data buffer system.

2. Description of Related Art

Data buffer systems are widely used in various electronic circuits, such as a memory device. For example, a data buffer system of the memory device is configured for transferring data signals in accordance with a read command or a write command. However, voltage variation and noise may significantly affect the performance of the data buffer system, which may fail the operation of the memory device in certain cases.

FIG. 1A is a circuit diagram of a data buffer system 100 according to a prior art. FIG. 1B is a wave diagram of the data buffer system 100. As shown in FIG. 1A, the data buffer system 100 includes a plurality of data buffers 120. The data buffer 120 includes a plurality of inverters 122 electrically coupled in cascade. Each of inverters 122 is driven directly by a supply voltage VCC. The voltage variation may exist in the supply voltage VCC, as shown in FIG. 1B, when the supply voltage goes high (i.e., high VCC), the time difference between the data signal VDATAIN01 and the data signal VDATAOUT01 is short, and the power consumption of the data buffer system 100 is increased. Alternatively, when the supply voltage goes low (i.e., low VCC), the time difference between the data signal VDATAIN01 and the data signal VDATAOUT01 is long, and the power consumption of the data buffer system 100 is decreased. If the time difference between the data signal VDATAOUT01 of the High VCC and the data signal VDATAOUT01 of low VCC is too large, the read/write operation of the memory device may be failed.

FIG. 1C is a circuit diagram of a data buffer system 100a according to another prior art. FIG. 1D and Fig. 1E show wave diagrams of the data buffer system 100a. The data buffer system 100a includes an amplifier 140, a PMOS 160 and a plurality of data buffers 120. The data buffer 120 includes a plurality of inverters 124 electrically coupled in cascade as well. The amplifier 140 and the PMOS 160 are configured for generating a regulated voltage VINT to drive all of the inverters 124. The data buffer system 100a can reduce the voltage variation on the supply voltage VCC, but the regulated voltage VINT suffers from noise generated by data switching in the inverters 124. For example, as shown in Fig.1D, the data signal VDATAIN01 is switched through one of the data buffers 120, and the other data signals VDATAIN02 and DATAIN03 are not switched. In this case (i.e., 1 data signal switching case), the data signal VDATAOUT01 can be generated normally. And, as shown in FIG. 1E, the data signal VDATAIN01, VDATAIN02 and VDATAIN03 are switched through the corresponding buffer 120. In this case (i.e., all data signals switching case), because the regulated voltage VINT is varied by the switching noise from the buffers 120, the time of the data signal VDATAOUT01 may vary.

Therefore, a heretofore unaddressed need exists in the art to address the aforementioned deficiencies and inadequacies.

SUMMARY

An aspect of the present invention is to provide a data buffer system. The data buffer system includes a plurality of data buffer modules and a plurality of switching units. The data buffer module is configured for buffering the corresponding data signal. The data buffer module includes a plurality of buffers. The buffers are electrically coupled in series. The switching unit is configured for supplying power to a corresponding buffer in accordance with a regulated voltage. Each of the switching units is electrically coupled between a corresponding one of the buffers and the supply voltage.

According to one embodiment of the present invention, each of the buffers includes an even number of the inverters electrically coupled in series, wherein each of the inverters includes a P-type transistor and an N-type transistor electrically coupled to the P-type transistor in cascade, wherein each of the switching units is electrically coupled between the P-type transistors of the corresponding one of the buffers and the supply voltage.

According to one embodiment of the present invention, each of the switching units includes an N-type transistor having a first terminal electrically coupled to the supply voltage, a second terminal electrically coupled to the P-type transistors of the corresponding one of the buffers, and a control terminal electrically coupled to the regulated voltage.

According to one embodiment of the present invention, the data buffer system further includes a power regulation module. The power regulation module is configured for generating the regulated voltage.

According to one embodiment of the present invention, the power regulation module includes an amplifier. The amplifier is configured for generating the regulated voltage in accordance with a reference voltage and the voltage.

According to one embodiment of the present invention, the power regulation module further includes a sensing switch, a first sensing resistor and a second sensing resistor. The sensing switch has a first terminal configured to generate the regulated voltage, a second terminal electrically coupled to an output terminal of the amplifier, and a control terminal electrically coupled to the second terminal. The first sensing resistor has a first terminal and a second terminal, wherein the first terminal of the first sensing resistor is electrically coupled to the second terminal of the sensing switch, and the second terminal of the first sensing resistor is configured for generating the feedback voltage. The second sensing resistor is electrically coupled between the second terminal of the first sensing resistor and ground.

Another aspect of the present invention is to provide a power control method for a data buffer system. The data buffer system includes a plurality of data buffer modules. Each of the data buffer modules includes a plurality of the inverters electrically coupled in series. The power control method includes the following operations of generating a regulated voltage VR supplying power to the buffers through a plurality of the switching units in accordance with the regulated VR, wherein each of the switching units is electrically coupled between a corresponding one of the buffers and a supply voltage.

According to one embodiment of the present invention, the operation of generating the regulated voltage further includes following operation of inputting a reference voltage and a feedback voltage to an amplifier for generating the regulated voltage, wherein the feedback voltage is generated by sensing the feedback voltage.

These and other features, aspects, and advantages of the present invention will become better understood with reference to the following description and appended claims.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1A:
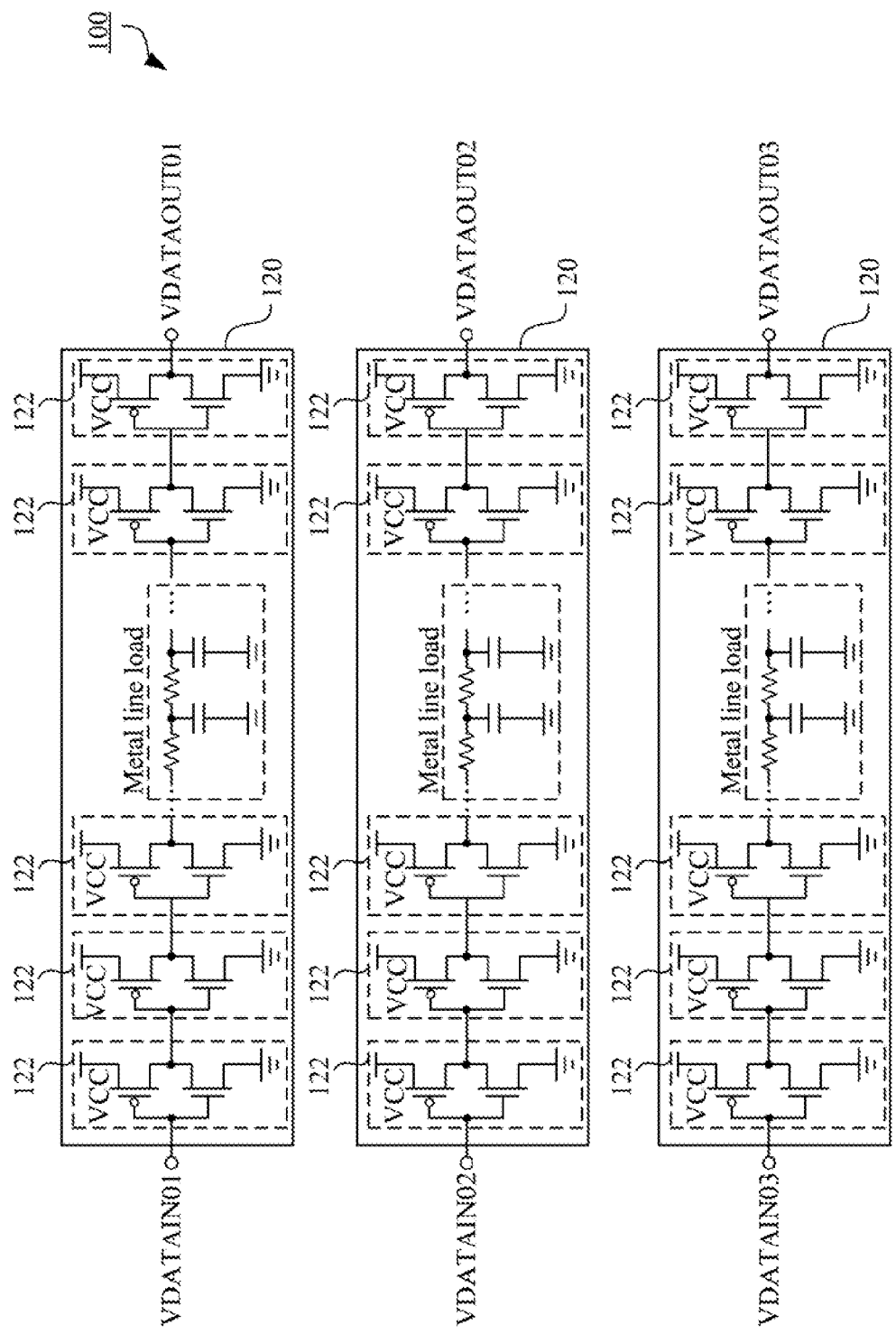
FIG. 1A is a circuit diagram of a data buffer system according to a prior art.
Figure 1B:
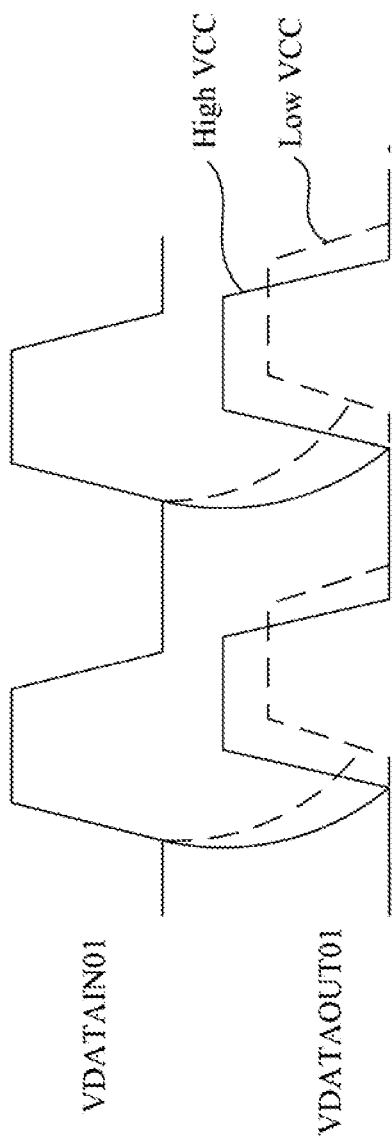
FIG. 1B is a wave diagram of the data buffer system.
Figure 1C:
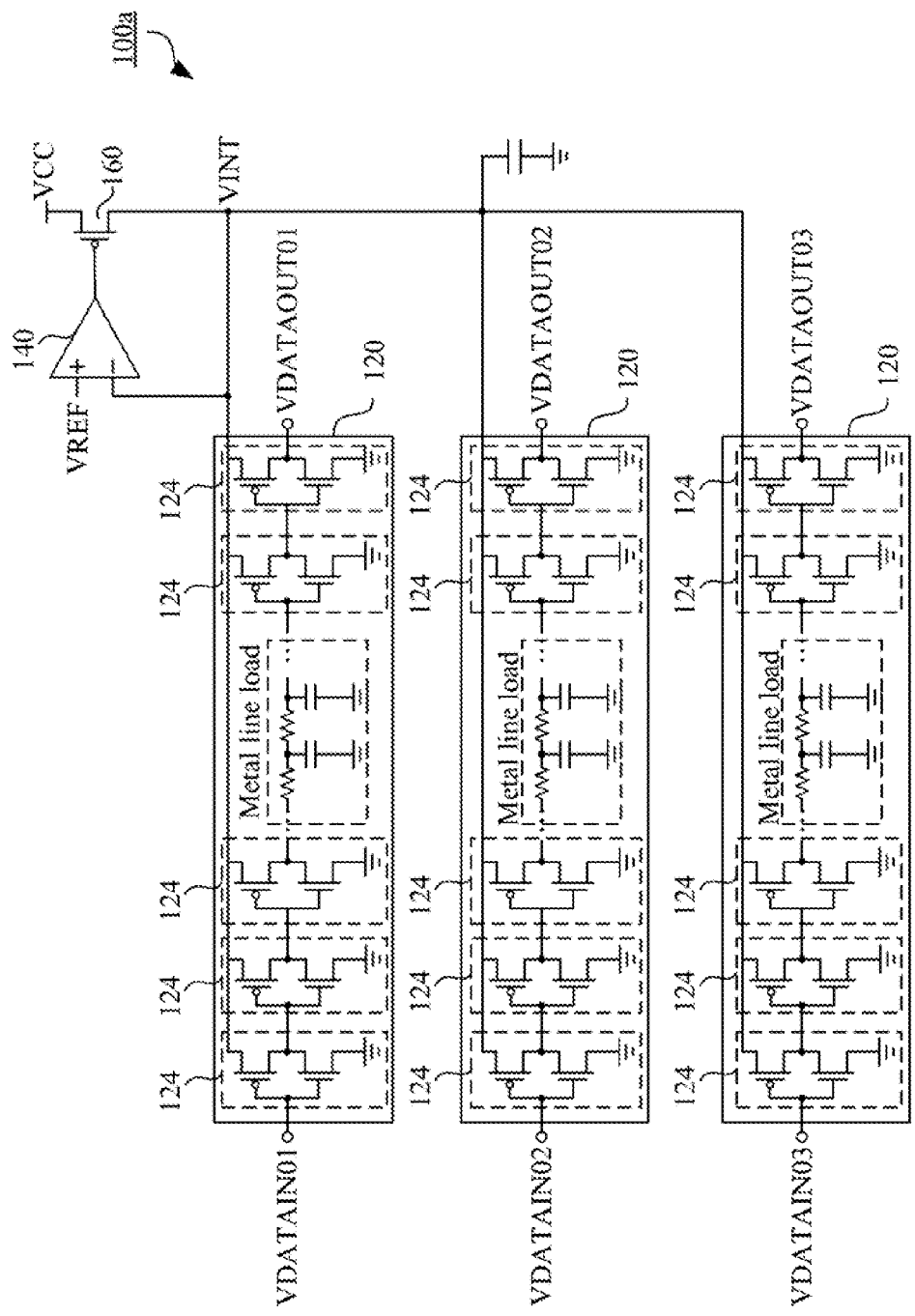
FIG. 1C is a circuit diagram of a data buffer system according to another prior art.
Figure 1D:
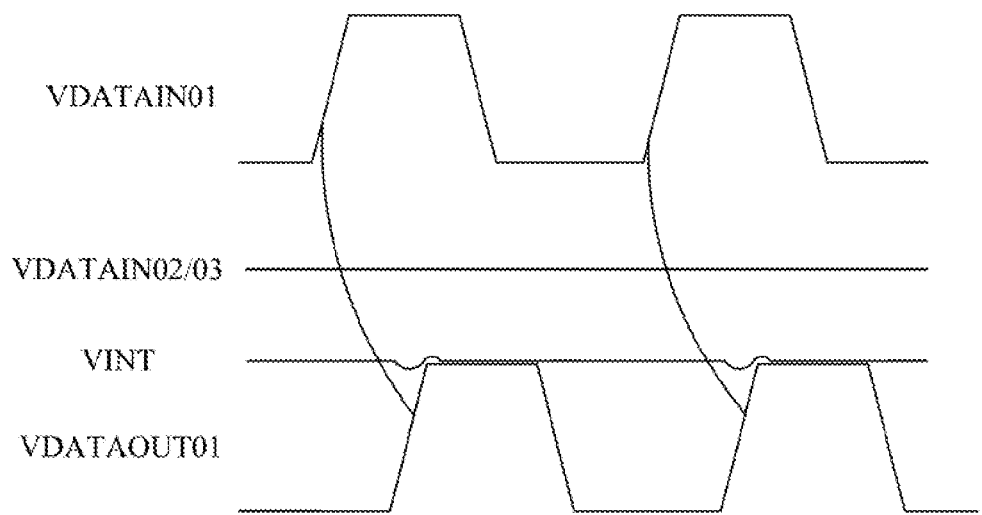
FIG. 1D and FIG. 1E show wave diagrams of the data buffer system.
Figure 1E:
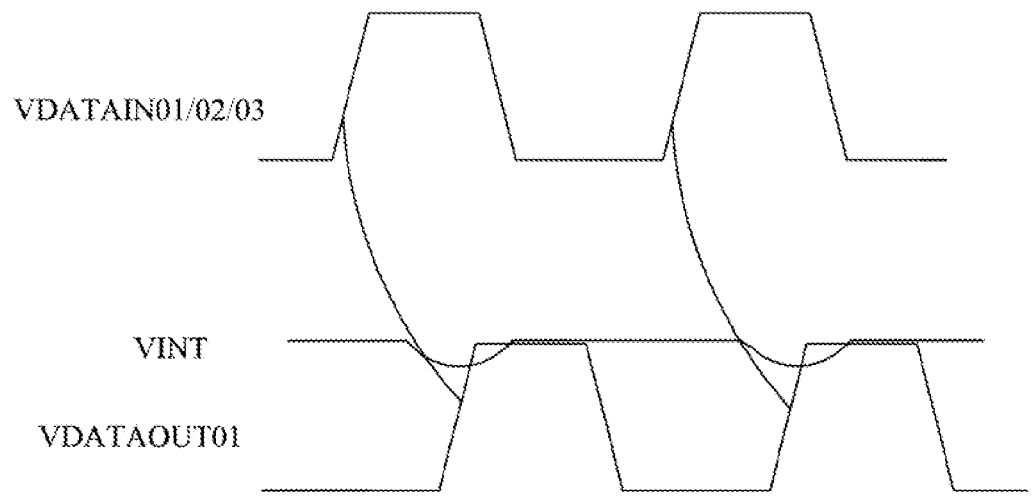

Reference will now be made in detail to the present embodiments of the invention, examples of which are illustrated in the accompanying drawings. Wherever possible, the same reference numbers are used in the drawings and the description to refer to the same or like parts.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

As used herein "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

Figure 2A:
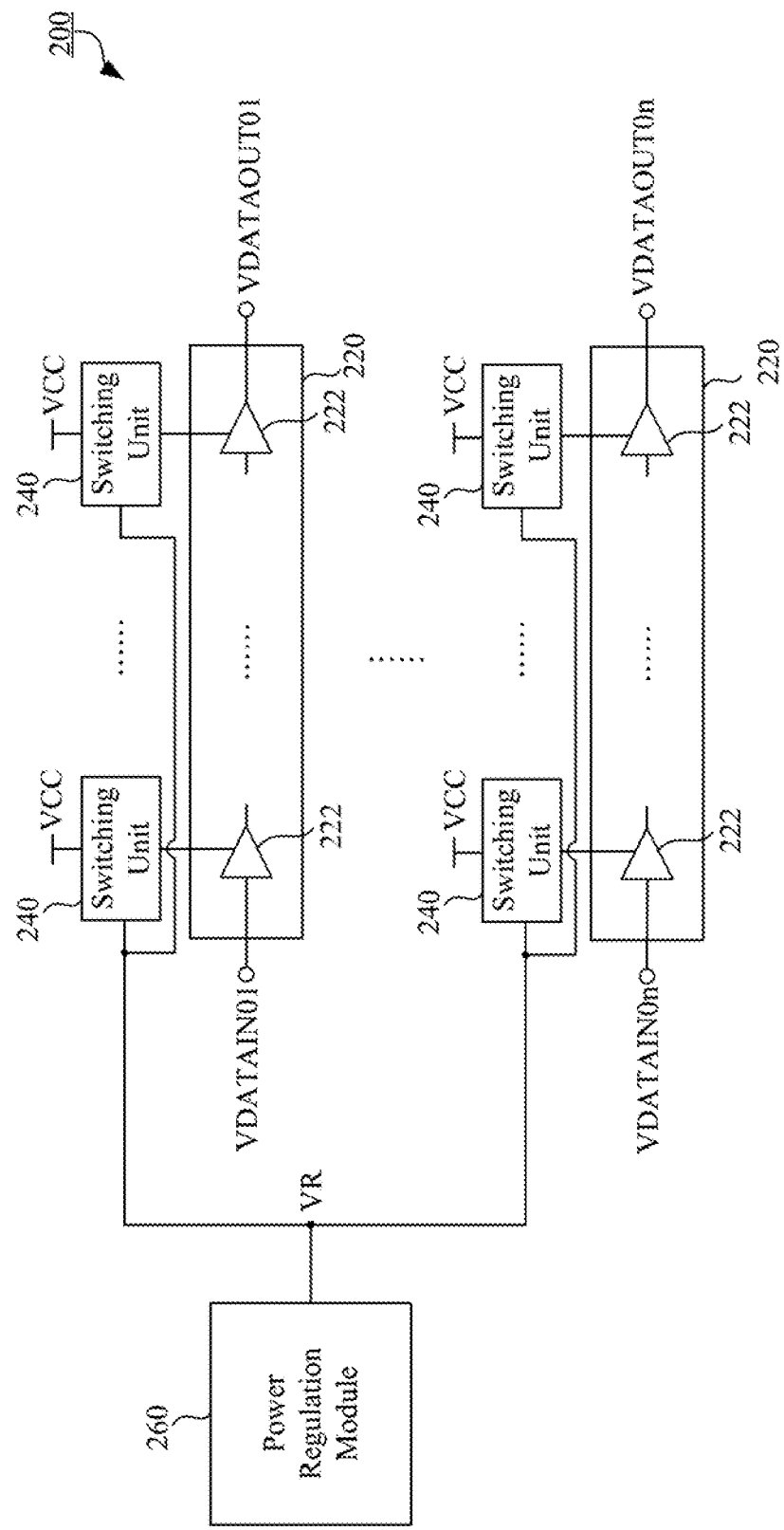
FIG. 2A is a block diagram of a data buffer system according to one embodiment of the present invention.

FIG. 2A is a block diagram of a data buffer system 200 according to one embodiment of the present invention. As shown in FIG. 2A, the data buffer system 200 includes a plurality of data buffer modules 220 and a plurality of switching unit 240. The data buffer module 220 is configured for buffering a corresponding data signal VDATAIN0n. The data buffer module 220 includes a plurality of buffers 222. The buffers 222 are electrically coupled in series. The switching unit 240 is configured for supplying power to a corresponding buffer 222 in accordance with a regulated voltage VR. Each of the switching units 240 is electrically coupled between a corresponding one of the buffers 222 and the supply voltage VCC.

The following paragraphs will discuss some embodiments about the data buffer system 200 in this invention. For purpose of specification, many details in practice will be described together with the following description. However, it should be understood that these details in practice are not used to limit the disclosure.

Figure 2B:
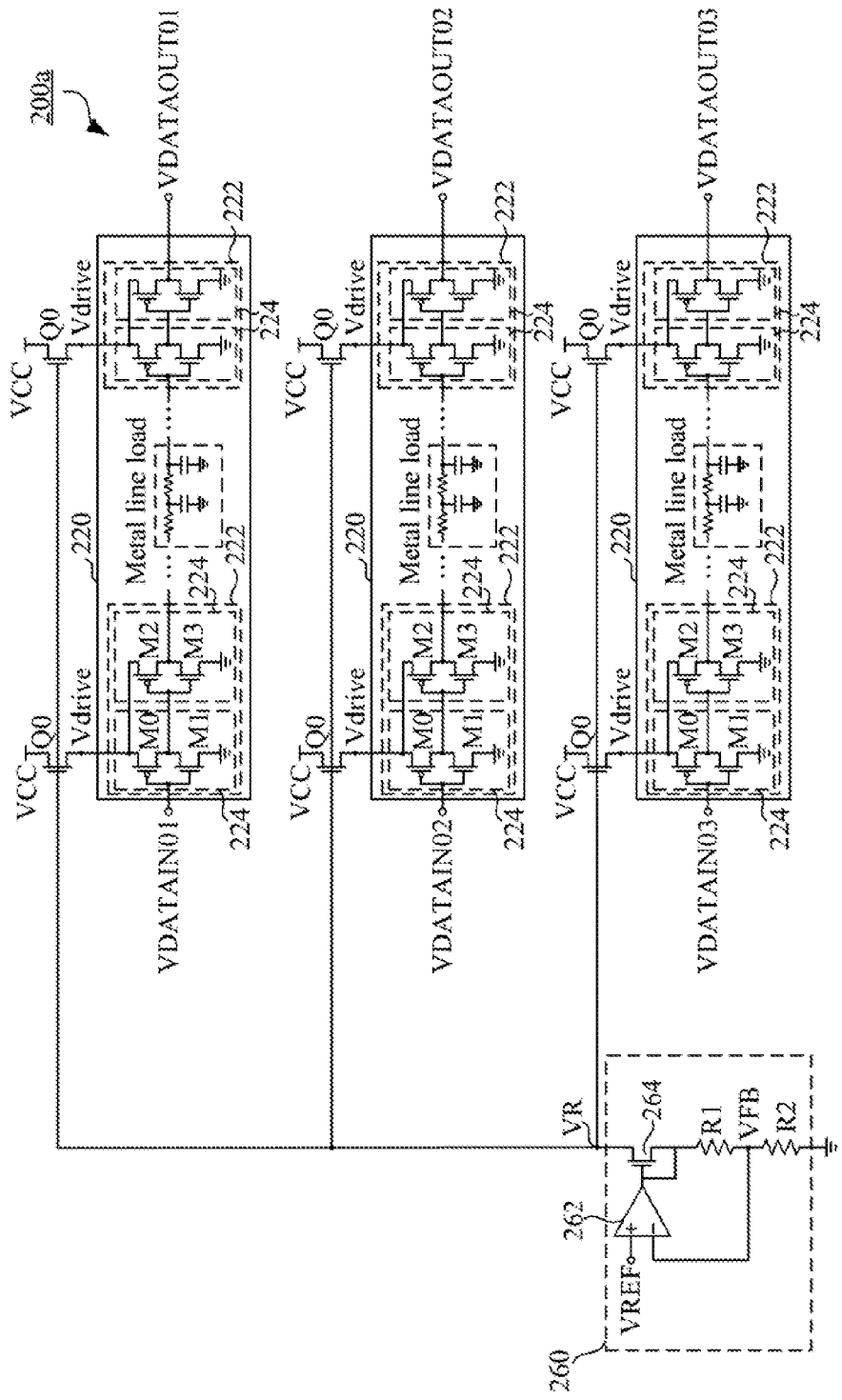
FIG. 2B is a circuit diagram of a data buffer system according to another embodiment of the present invention.

FIG. 2B is a circuit diagram of a data buffer system 200a according to another embodiment of the present invention. In this embodiment, the buffer 222 may include an even number of the inverters 224. The inverters 224 in one buffer 222 are electrically coupled in series.

For example, as shown in FIG. 2B, the buffer 222 includes two inverters 224. In other words, the buffer 222 includes a first P-type transistor M0, a first N-type transistor M1, a second P-type transistor M2 and a second N-type transistor M3. The first P-type transistor M0 and the first N-type transistor M1 form an inverter 224, and the second P-type transistor M2 and the second N-type transistor M3 form the other inverter 224. Practically speaking, a first terminal of the first N-type transistor M1 is electrically coupled to a second terminal of the first P-type transistor M0, a second terminal of the first N-type transistor M1 is electrically coupled to ground, and a control terminal of the first N-type transistor M1 is electrically coupled to a control terminal of the first P-type transistor M0. A first terminal of the second P-type transistor M2 is electrically coupled to a first terminal of the first P-type transistor M0, and a control terminal of the second P-type transistor M2 is electrically coupled to the second terminal of the first P-type transistor M0. A first terminal of the second N-type transistor M3 is electrically coupled to a second terminal of the second P-type transistor M2, a second terminal of the second N-type transistor M3 is electrically coupled to ground, and a control terminal of the second N-type transistor M3 is electrically coupled to a control terminal of the second P-type transistor M2.

Further, the switching unit 240 is electrically coupled between the aforementioned P-type transistors of the corresponding buffer 222 and the supply voltage VCC. For example, the switching unit 240 includes an N-type transistor Q0. A first terminal of the N-type transistor Q0 is electrically coupled to the supply voltage VCC, a second terminal of the N-type transistor Q0 is electrically coupled to the first terminal of the first P-type transistor M0, and a control terminal of the N-type transistor Q0 is electrically coupled to the regulated voltage VR.

In this embodiment, the buffers 222 are driven by the drive voltage Vdrive which is the voltage at the first terminal of the P-type transistor M0 of the inverter 224. The drive voltage Vdrive can be maintained at the same voltage level during data switching in the data buffer system 100a. For example, when the supply voltage VCC is 1.4V, the regulated voltage VR is 1.6V and the threshold voltage Vtn of the N-type transistor Q0 is 0.6V. The drive voltage Vdrive can be determined as follows: Vdrive=VR~Vtn=1V. As the threshold voltage of the transistor can be determined by the manufacturing process, it means that the regulated voltage VR of the buffers 222 can be kept at the same voltage level under the variation of the supply voltage VCC and the data signals switching.

Figure 2C:
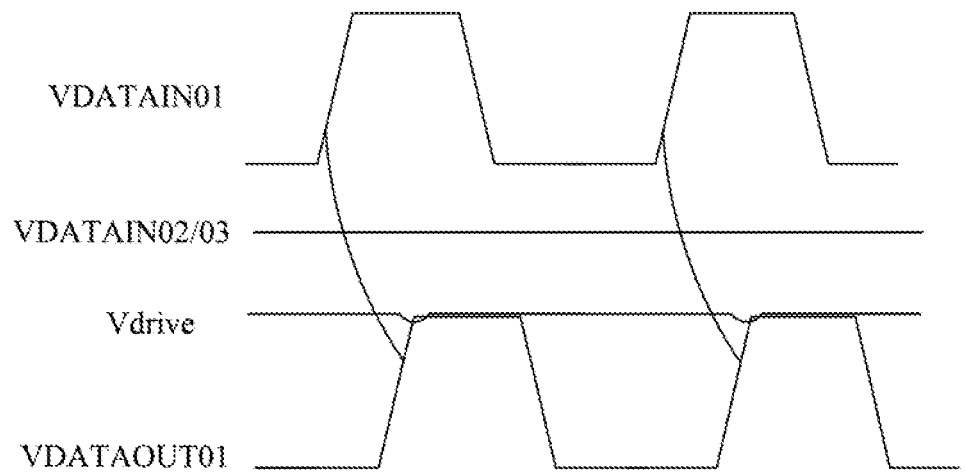
FIG. 2C and FIG. 2D show wave diagrams of the data buffer system according to another embodiment of the present invention.
Figure 2D:
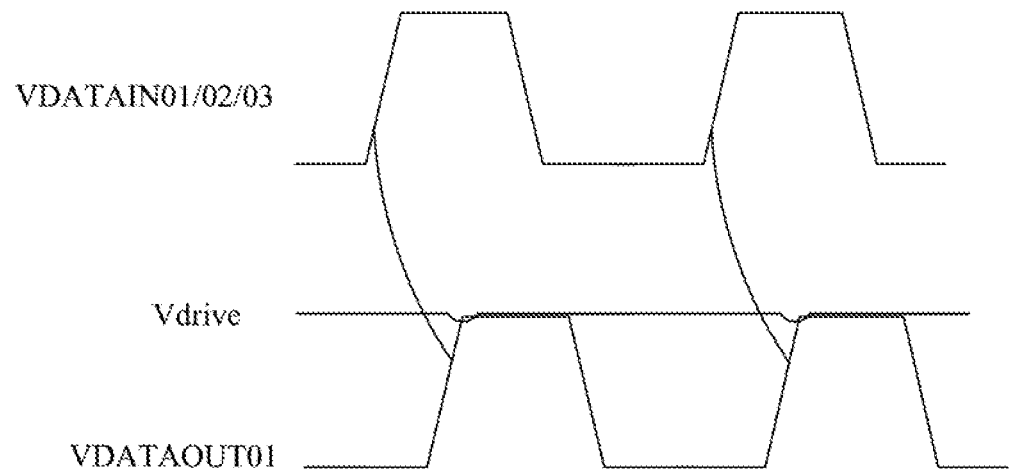

FIG. 2C and FIG. 2D show wave diagrams of the data buffer system 200a according to one embodiment of the present invention. As shown in FIG. 2C, a data signal VDATAIN01 is switched through one of the data buffer modules 220, and the other data buffer modules 220 are not in switching operation. In this case (i.e., 1 data switching case), because the drive voltage Vdrive can be maintained at a predetermined voltage level, such as 1V, without being affected by the variation of supply voltage VCC, the data signal VDATAOUT01 can be generated normally. As shown in FIG. 2D, the data signals VDATAIN01 VDATAIN02 and VDATAIN03 are respectively switched through the corresponding data buffer module 220. In this case (i.e., all data switching case), because the drive voltage Vdrive can be maintained under the influence of the noise generated by the data signals switching, the data signal VDATAOUT01 can be generated with minimum delay. In other words, the data buffer system 200a can be operated correctly with minimum signal delay under the supply voltage variation.

In other embodiment of the present invention, as shown in FIG. 2A, the data buffer system 200a may further include a power regulation module 260. The power regulation module 260 is configured for generating the regulated voltage VR. For example, as shown in FIG. 2B, the power regulation module 260 includes an amplifier 262, a sensing switch 264, a first sensing resistor R1 and a second sensing resistor R2. The amplifier 262 is configured for generating the regulated voltage VR in accordance with the reference voltage VREF and the feedback voltage VFB. The reference voltage VREF can be provided from a band-gap reference circuit or the like. The sensing switch 264, the first sensing resistor R1 and the second sensing resistor R2 form a feedback path. The feedback path is configured for sensing the regulated voltage VR to generate the feedback voltage VFB.

Practically speaking, a first terminal of the sensing switch 264 is electrically coupled to the regulated voltage VR, and a control terminal of the sensing switch 264 is electrically coupled to the first terminal of the sensing switch 264. A first terminal of the first sensing resistor R1 is electrically coupled to a second terminal of the sensing switch 264. The second resistor R2 is electrically coupled between a second terminal of the first sensing resistor R1 and ground, and the second terminal of the first sensing resistor R1 is configured for generating the feedback voltage VFB. One of inputs of the amplifier 262 is configured for receiving the reference voltage VREF, another one of the inputs of the amplifier 262 is electrically coupled to the second terminal of the first sensing resistor R1, and an output of the amplifier 262 is configured for generating the regulated voltage VR.

By using the amplifier 262 and the feedback path formed by the sensing switch 264, the first sensing resistor R1 and the second sensing resistor R2, the regulated voltage VR can be regulated to be a fixed voltage level. This invention is not limited to the power regulation module 260 shown in FIG. 2B, the one of ordinary skill in the art can utilize any type of the power regulation module in accordance with the practical application.

Figure 3:
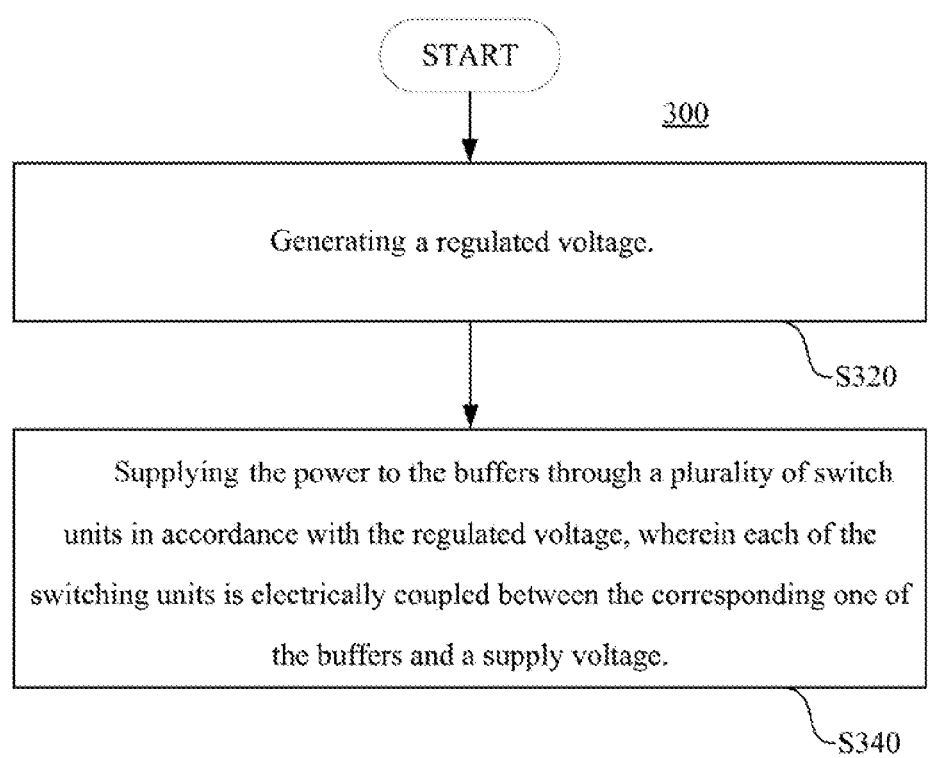
FIG. 3 is a flow chart of a power control method according to one embodiment of the present invention.

Another aspect of present invention is to provide a power control method for a data buffer system. The data buffer system may include a plurality of data buffer modules. Each of the data buffer modules includes a plurality of the inverters electrically coupled in series. FIG. 3 is a flow chart of a power control method 300 according to one embodiment of the present invention. As shown in FIG. 3, the power control method 300 includes the following operations of generating a regulated voltage VR (step S320); supplying the power to the buffers through a plurality of the switching units in accordance with the regulated VR, wherein each of the switching units is electrically coupled between the corresponding one of the buffers and a supply voltage (step S340).

In step S320, for example, a reference voltage VREF and a feedback voltage VFB are inputted to the amplifier 260 to generate the regulated voltage VR, as shown in FIG. 2B. The feedback voltage VFB is generated by sensing the regulated voltage VR.

In step S340, for example, each of the buffers 222 may include an even number of the inverters 224, as shown in FIG. 2B. Each of the inverters 224 includes a P-type transistor M0 and a N-type transistor M1 electrically coupled to the P-type transistor M0 in cascade. Each of switching unit (i.e., Q0) is electrically coupled between the P-type transistors of the corresponding one of the buffers 222 and the supply voltage. As described above, because the buffers 222 are driven by the drive voltage Vdrive which is kept at a fixed voltage level by the switching units (i.e., Q0), the data buffer modules 220 can operate correctly under supply voltage variation.

In summary, the present invention provides a data buffer system and a power control method. The data buffer system is capable of working in low voltage operation with minimum delay and minimum data switching noise affect under supply voltage variation.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A data buffer system, comprising:
   a plurality of data buffer modules, wherein each of the data buffer modules comprises a plurality of buffers electrically coupled in series; and
   a plurality of switching units for supplying power to the buffers in accordance with a regulated voltage, wherein each of the switching units is electrically coupled between a corresponding one of the buffers and a supply voltage,
   wherein each of the buffers comprises an even number of the inverters electrically coupled in series, wherein each of the inverters comprises a P-type transistor and an N-type transistor electrically coupled to the P-type transistor in cascade.

2. The data buffer system of the claim 1, wherein each of the switching units is electrically coupled between the P-type transistors of the corresponding one of the buffers and the supply voltage.

3. The data buffer system of the claim 2, wherein each of the switching units comprises an N-type transistor having a first terminal electrically coupled to the supply voltage, a second terminal electrically coupled to the P-type transistors of the corresponding one of the buffers, and a control terminal electrically coupled to the regulated voltage.

4. The data buffer system of the claim 1, further comprising:
   a power regulation module configured for generating the regulated voltage.

5. The data buffer system of the claim 4, wherein the power regulation module comprises:
   an amplifier configured for generating the regulated voltage in accordance with a reference voltage and a feedback voltage.

6. The data buffer system of the claim 5, wherein the power regulation module further comprises:

a sensing switch having a first terminal configured to generate the regulated voltage, a second terminal electrically coupled to an output terminal of the amplifier, and a control terminal electrically coupled to the second terminal;

a first sensing resistor having a first terminal and a second terminal, wherein the first terminal of the first sensing resistor is electrically coupled to the second terminal of the sensing switch, and the second terminal of the first sensing resistor is configured for generating the feedback voltage; and a second sensing resistor electrically coupled between the second terminal of the first sensing resistor and ground.

7. A data buffer system, comprising:

a plurality of data buffer modules, wherein each of the data buffer modules comprises a plurality of buffers electrically coupled in series, and each of the buffers comprising:

a first P-type transistor having a first terminal, a second terminal, and a control terminal;

a first N-type transistor having a first terminal electrically coupled to the second terminal of the first P-type transistor, a second terminal electrically coupled to ground, and a control terminal electrically coupled to the control terminal of the first P-type transistor;

a second P-type transistor having a first terminal electrically coupled to the first terminal of the first P-type transistor, a second terminal, and a control terminal electrically coupled to the second terminal of the first P-type transistor; and a second N-type transistor having a first terminal electrically coupled to the second terminal of the second P-type transistor, a second terminal electrically coupled to ground, and a control terminal electrically coupled to the control terminal of the second P-type transistor; and a plurality of switching units, wherein each of the switching units comprises a first terminal electrically coupled to a supply voltage, a second terminal electrically coupled to the first terminal of the first P-type transistor of a corresponding one of the buffers, and a control terminal for receiving a regulated voltage.

8. The data buffer system of the claim 7, wherein each of the switching units comprises an N-type transistor.

9. The data buffer system of the claim 7, further comprising:

a sensing switch having a first terminal electrically coupled to the regulated voltage, a second terminal, and a control terminal electrically coupled to the second terminal of the sensing switch;

a first sensing resistor, wherein a first terminal of the first sensing resistor is electrically coupled to the second terminal of the sensing switch; and a second sensing resistor electrically coupled between a second terminal of the first sensing resistor and ground; and an amplifier, wherein one of inputs of the amplifier is configured for receiving a reference voltage, and another one of the inputs of amplifier is electrically coupled to the second terminal of the first sensing resistor, and an output terminal of the amplifier is configured to generate the regulated voltage.

10. A power control method for a data buffer system, wherein the data buffer system comprises a plurality of data buffer modules, and each of the data buffer modules comprises a plurality of buffers electrically coupled in series, the power control method comprising:

generating a regulated voltage; and supplying power to the buffers through a plurality of switching units in accordance with the regulated voltage, wherein each of the switching units is electrically coupled between a corresponding one of the buffers and a supply voltage, wherein each of the buffers comprises an even number of the inverters electrically coupled in series, wherein each of the inverters comprises a P-type transistor and an N-type transistor electrically coupled to the P-type transistor in cascade.

11. The power control method of the claim 10, wherein each of the switching units is electrically coupled between the P-type transistors of a corresponding one of the buffers and the supply voltage.

12. The power control method of the claim 11, wherein each of the switching units comprises an N-type transistor having a first terminal electrically coupled to the supply voltage, a second terminal electrically coupled to the P-type transistors of the corresponding one of the buffers, and a control terminal electrically coupled to the regulated voltage.

13. The power control method of the claim 10, wherein the operation of generating the regulated voltage further comprises:

inputting a reference voltage and a feedback voltage to an amplifier for generating the regulated voltage, wherein the feedback voltage is generated by sensing the regulated voltage.

* * * * *